United States Patent
Goodwin et al.

(10) Patent No.: US 6,442,045 B1
(45) Date of Patent: Aug. 27, 2002

(54) STAKE ATTACHED CONTACT ASSEMBLY IN AN INTEGRATED CIRCUIT SOCKET ASSEMBLY

(75) Inventors: Jonathan W. Goodwin, Braintree, MA (US); Curtis G. Knaub, North Attleboro, MA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/036,824

(22) Filed: Nov. 7, 2001

Related U.S. Application Data

(63) Continuation-in-part of application No. 09/943,596, filed on Aug. 30, 2001.

(51) Int. Cl.[7] .................................................. H05K 9/00
(52) U.S. Cl. ...................... 361/816; 361/818; 174/35 R
(58) Field of Search ................................. 361/816, 818, 361/728, 736, 742; 174/35 R

(56) References Cited

U.S. PATENT DOCUMENTS

| | | | |
|---|---|---|---|
| 4,513,353 A | * | 4/1985 | Bakermans et al. ........ 174/261 |
| 5,880,930 A | * | 3/1999 | Wheaton .................... 361/690 |
| 5,919,050 A | * | 7/1999 | Kehley et al. ............... 439/526 |
| 6,043,983 A | * | 3/2000 | Taylor et al. ........... 174/35 GC |
| 6,061,235 A | * | 5/2000 | Cromwell et al. ......... 165/80.3 |
| 6,155,860 A | * | 12/2000 | Lemke et al. ................ 439/341 |
| 6,198,630 B1 | * | 3/2001 | Cromwell ................... 165/80.3 |
| 6,271,482 B1 | * | 8/2001 | Crotzer et al. .............. 174/262 |

* cited by examiner

Primary Examiner—David S. Martin
Assistant Examiner—Thanh S. Phan

(57) ABSTRACT

A method for securing a contact assembly to a frame in an integrated circuit socket via cold forming. A plurality of posts are integrally formed with and extend from the bottom surface of the frame of an integrated circuit device socket. The contact assembly includes a plurality of conductive columns mounted within an insulating sheet in a predetermined contact pattern. The insulating sheet also has a plurality of post receiving apertures that are selectively positioned such that the posts extend through corresponding apertures in the insulating sheet when the contact assembly is positioned in a mounting position on the bottom surface of the frame. The posts are cold staked to expand the diameter of the post ends and to secure the contact assembly to the frame. Integral spacer abutments are provided on the bottom surface of the frame to provide a planar mounting surface for the socket and to precisely space the insulating sheet from the printed circuit board when the socket is mounted to the printed circuit board.

11 Claims, 6 Drawing Sheets

STAKE ATTACHED CONTACT ASSEMBLY IN AN INTEGRATED CIRCUIT SOCKET ASSEMBLY

CROSS REFERENCE TO RELATED APPLICATIONS

This application is a continuation-in-part application of U.S. patent application Ser. No. 09/943,596 filed Aug. 30, 2001 and titled Integrated Circuit Socket Assembly Having Integral Shielding Members.

STATEMENT REGARDING FEDERALLY SPONSORED RESEARCH OR DEVELOPMENT

N/A

BACKGROUND OF THE INVENTION

The present invention relates to integrated circuit sockets and more specifically, to a method for mounting a contact assembly to a frame member of a socket assembly.

Sockets are known for integrated circuits that such as land grid array (LGA) integrated circuit devices. An LGA integrated circuit device typically has a rectangular housing or body and an array of contacts on the bottom surface of the housing arranged in a predetermined contact pattern. These contacts are mateable with contacts of the LGA socket when the integrated circuit device is disposed within the socket.

During the manufacture of the sockets for LGA devices it is necessary to be able to securely mount a contact assembly to the supporting frame. It would be desireable to have be able to securely mount the contact assembly to the frame in a manner that is conducive to the use of high speed manufacturing machinery to permit high volume manufacture of integrated circuit sockets.

BRIEF SUMMARY OF THE INVENTION

In accordance with the present invention, a method for mounting a contact assembly to a frame to form an LGA integrated circuit socket assembly is disclosed. A plurality of posts are integrally formed with and extend from the bottom surface of the frame of the integrated circuit socket in a predetermined post pattern. A contact assembly is provided that includes an insulating sheet having a plurality of apertures arranged in a predetermined contact pattern corresponding to a contact pattern on the underside of an LGA integrated circuit device. A plurality of conductive columns are mounted within the apertures of the insulating sheet. The insulating sheet includes a plurality of post receiving apertures arranged in the predetermined post pattern such that the upstanding posts extend through the post receiving apertures when the insulating sheet is aligned in a mounting position with respect to the frame. To retain the contact assembly in assembled relation with respect to the frame, the insulating sheet is aligned and positioned on the frame such that the posts extend through the post receiving apertures of the insulating sheet. The ends of the posts are then cold staked in increase the diameter of the posts and to form a post head that fixably mounts the insulating sheet to the frame within the socket assembly.

Integrally formed spacer abutments are provided on the underside of the frame to space the bottom surface of the frame a predetermined height above a printed circuit board when the socket assembly is mounted to the printed circuit board. The distance from the bottom surface of the frame to the top of the posts following the cold staking operation is less than the predetermined height of the spacer abutments to assure that the socket assembly is maintained at the proper height with respect to the printed circuit board and thus maintain proper contact forces between the lower end of the conductive columns and corresponding conductive pads on the printed circuit board. In the foregoing manner adhesives need not be employed in the manufacturing process and the LGA integrated circuit sockets may be manufactured using high speed assembly equipment.

Other features, aspects and advantages of the presently disclosed method for mounting a contact assembly to the frame of an LGA integrated circuit socket will be apparent from the Detailed Description and the Drawings that follow.

BRIEF DESCRIPTION OF THE SEVERAL VIEWS OF THE DRAWING

The invention will be more fully understood from the following detailed description taken in conjunction with the accompanying drawings of which.

DETAILED DESCRIPTION OF THE INVENTION

Figure 1:
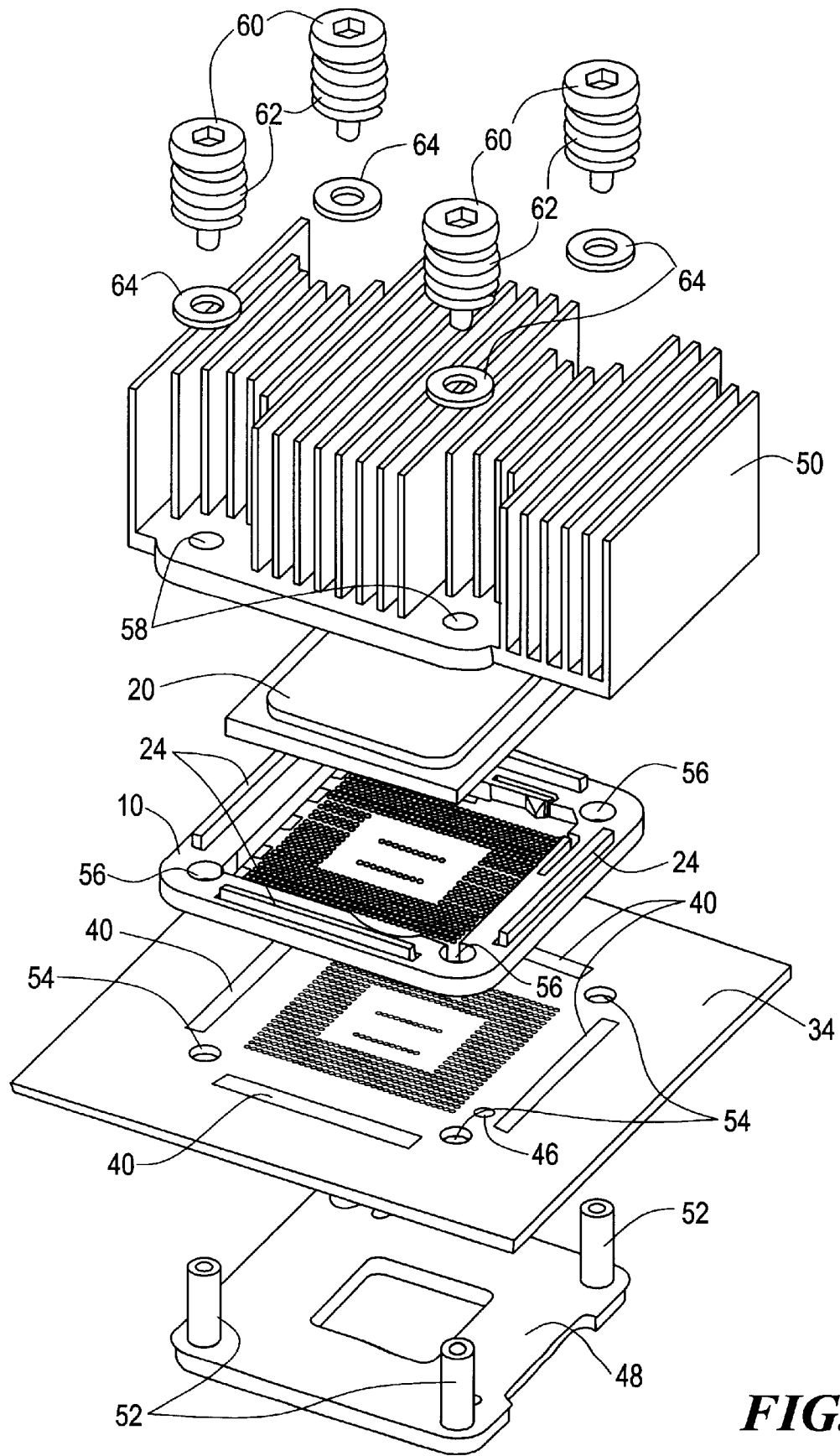
FIG. 1 is an exploded view of an LGA integrated circuit packaging assembly including a socket assembly in accordance with the present invention.
Figure 2:
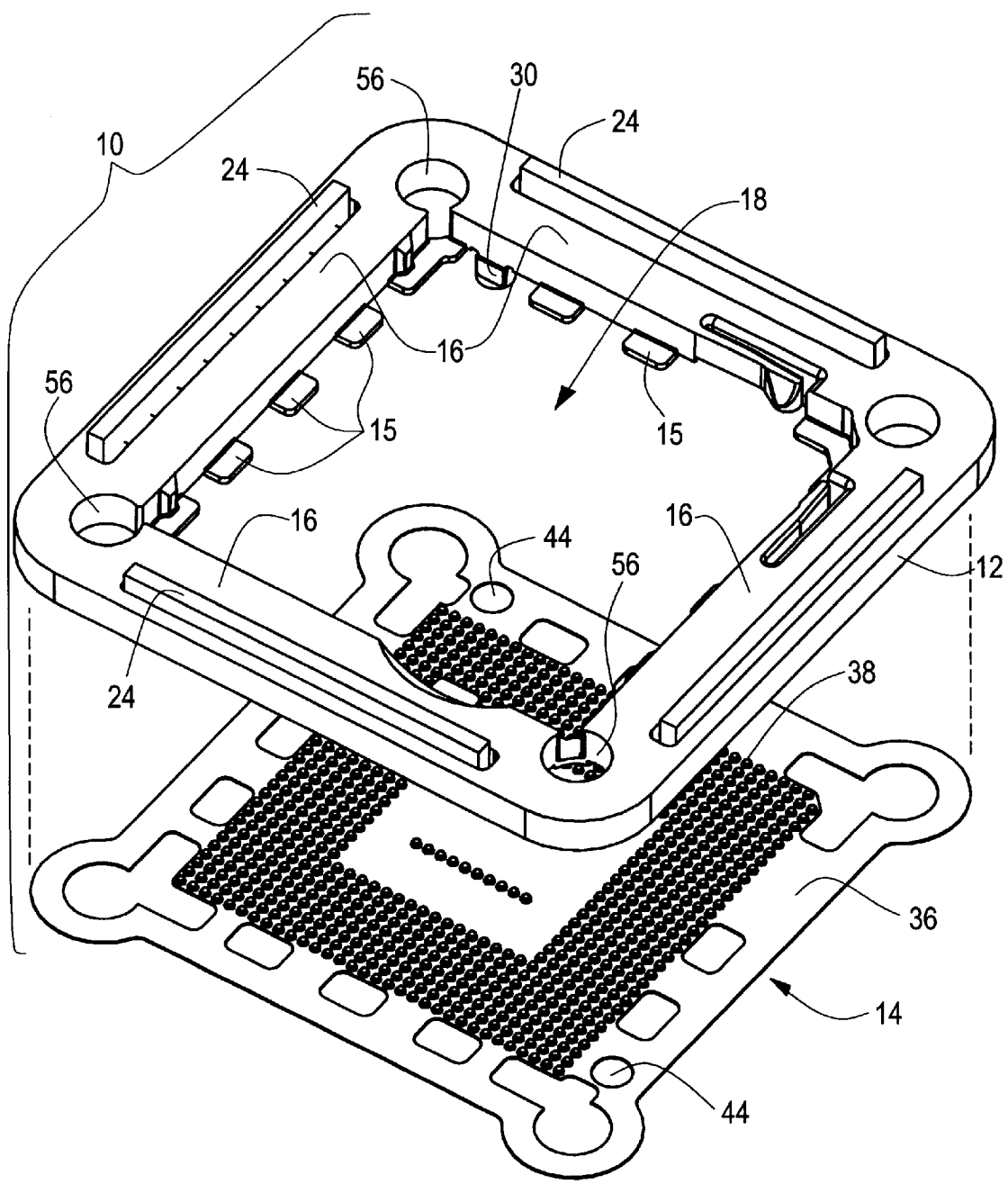
FIG. 2 is a pictorial view of the socket assembly of FIG. 1.
Figure 3A:
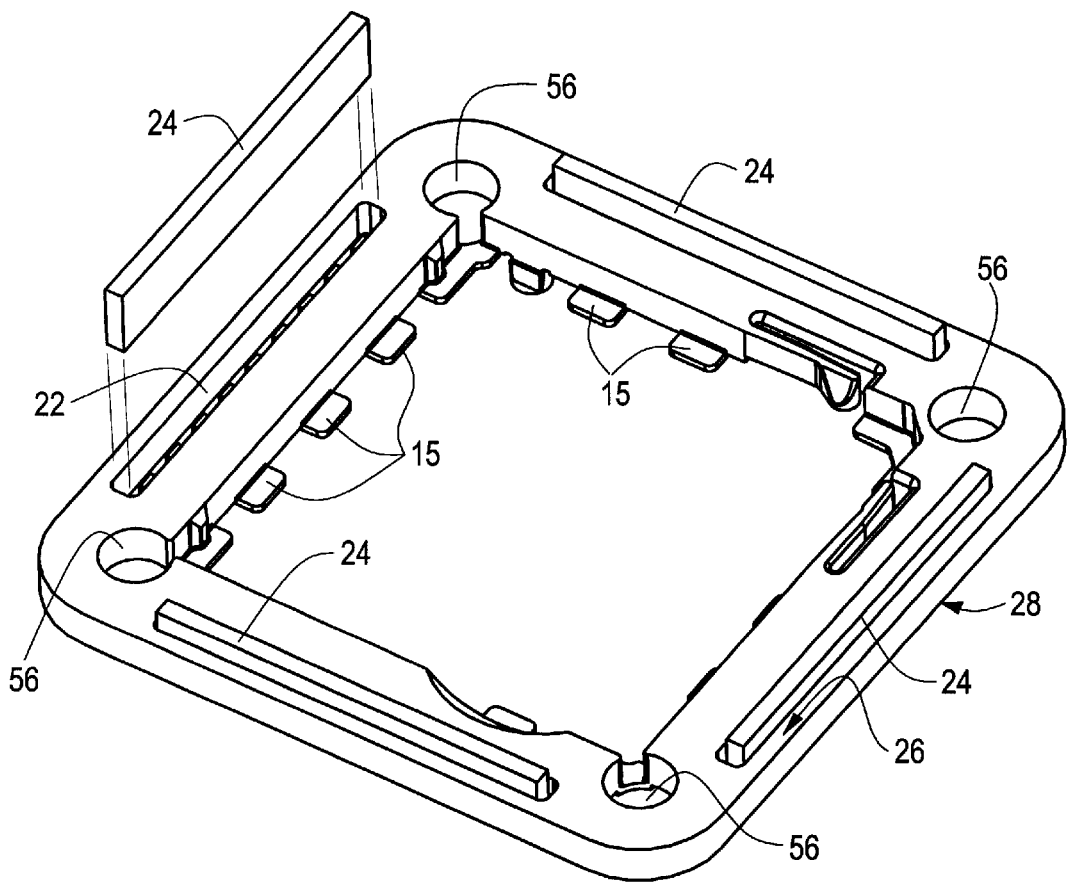
FIG. 3a is a pictorial top view of the frame employed in the socket assembly of FIG. 2.
Figure 3B:
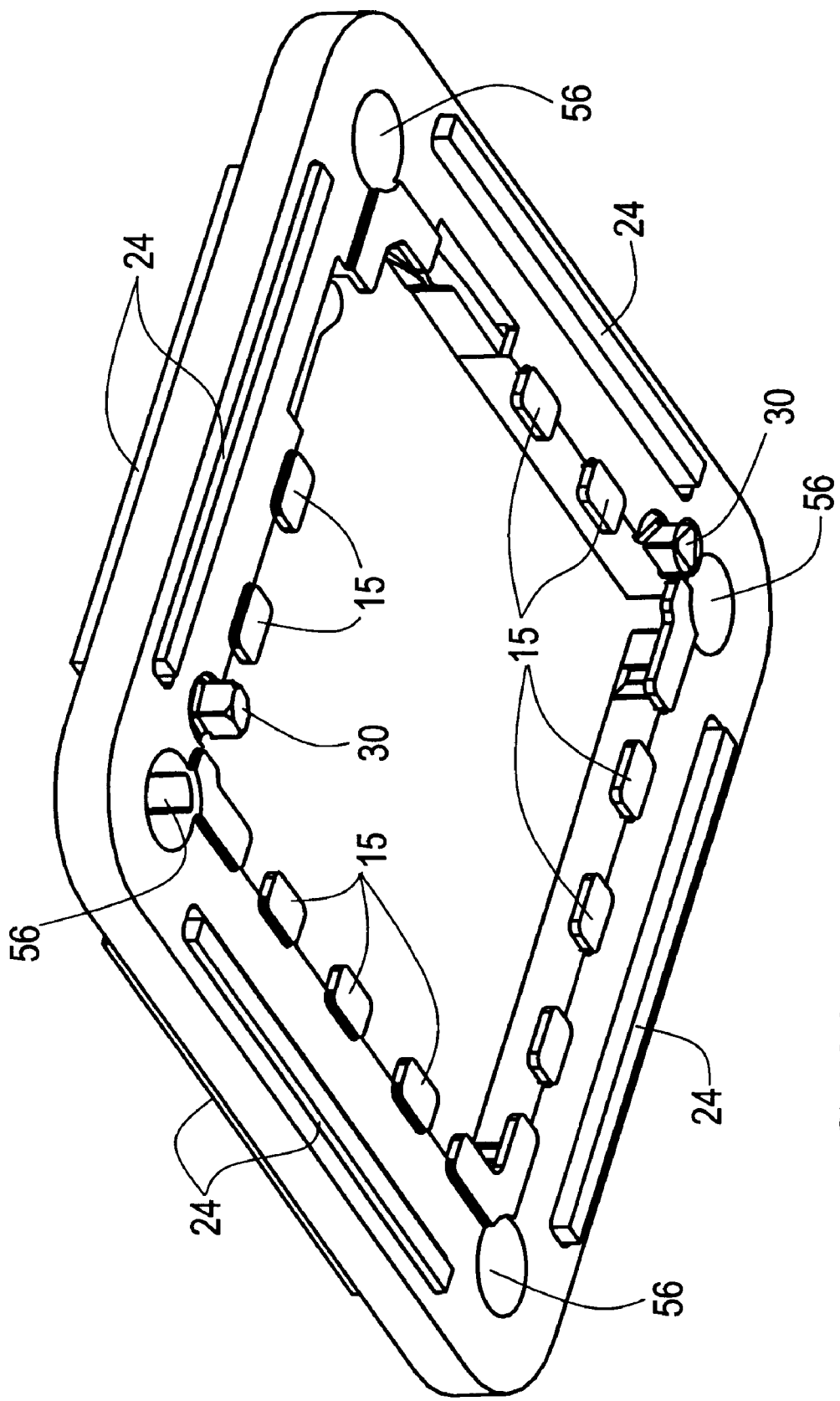
FIG. 3b is a pictorial bottom view of the frame employed in the socket assembly of FIG. 2.

Referring to FIGS. 1–3b, a packaging assembly including a socket assembly for an integrated circuit device such as an LGA device is shown. The packaging assembly provides EMI shielding for an integrated circuit mounted within the socket assembly.

More specifically, the packaging assembly includes a socket assembly 10 that includes a non-conductive frame 12 that is mounted to a contact assembly 14. The frame 12 is generally square or rectangular in shape and has four side members 16 that define a shallow central cavity 18. The frame 12 is preferably formed as an integrally molded plastic part and is sized to accommodate an integrated circuit package 20, such as an LGA package, within the central cavity 18. The integrated circuit package 20 includes a plurality of contacts on one surface thereof that are arranged in a predetermined contact pattern (contact pattern not shown). The frame 12 includes vertical slotted openings 22 extending through the side members 16 of the frame 12.

Conductive shielding members 24 are disposed within the slotted openings 22 and retained within the openings 22 via a friction fit. In the illustrated embodiment, the conductive shielding members 24 are formed of a conductive elastic polymer a conductive elastic rubber, a metal or any other suitable conductive material.

The conductive shielding members 24 in one embodiment are generally parallelepipeds having rectangular faces. The shielding members 24 are sized so as to extend slightly above the top surface 26 and below the bottom surface 28 of the frame 12 when the resilient conductive shielding members 24 are in an uncompressed state.

The frame 12 includes a set of alignment posts 30 for locating the contact assembly 14 with respect to the frame 12 and for aligning the frame 12 with respect to the printed circuit board 34. The frame 12 also includes abutments 15 that define a mounting surface for the integrated circuit device 20. More specifically, the bottom surface of the integrated circuit device 20 abuts the abutments 15 when the integrated circuit device is mounted within the socket assembly 10.

The contact assembly 14 includes an insulating sheet 36 having an array of resilient conductive columns 38 having upper and lower contact ends. The conductive columns 38 are mounted in respective openings within the insulating sheet 36 as described in U.S. Pat. No. 6,271,482 issued Aug. 7, 2001 and owned by the assignee of the present invention. The conductive columns 38 are arranged in a predetermined contact pattern corresponding to the contact pattern of the integrated circuit package 20 such that the contacts of the integrated circuit package contacts mate with the corresponding conductive columns 38 mounted to the insulating sheet 36 when the integrated circuit package 20 is mounted within the socket assembly 10. In an uncompressed state, the conductive columns 38 extend approximately 0.010 inch above the mounting surface defined by the abutments 15 so the contacts on the bottom surface of the integrated circuit device 20 compressively engage the top ends of the conductive columns 38 when the integrated circuit device is mounted within the socket assembly 10. The contact assembly 14 is mounted to the underside of the frame 12 using an acrylic adhesive or via any other suitable mounting technique and is aligned with respect to the frame via alignment posts 30 that pass through cooperative alignment holes 44 in the insulating sheet 36.

When mounting the socket assembly 10 to the circuit board 34, the socket assembly 10 is aligned with respect to the circuit board 34 via the alignment posts 30 that extend from the bottom surface of the frame 12. The alignment posts 30 are cooperative with corresponding alignment holes 46 in the circuit board 34 to accurately maintain the socket assembly 10 in position so that the lower ends of the conductive columns 38 engage corresponding contacts on the circuit board 34. When the socket assembly 10 is aligned with respect to the circuit board 34, the conductive shielding members 24 contact conductive areas 40 on the circuit board 34 that are electrically coupled to a ground plane. The lower ends of the conductive columns 38 that engage the corresponding contacts on the circuit board 34 may be coated with a conductive polymer or other material which bonds to the contacts of the circuit board 34. The other contact ends of the conductive columns 38 which engage the contacts on the integrated circuit package 20 do not bond to the integrated circuit package contacts so that the integrated circuit package 20 remains removable from the socket assembly 10.

The packaging assembly for the integrated circuit comprises a sandwich that includes a mounting frame 48, the printed circuit board 34, the socket assembly 10, the integrated circuit package 20, and an electrically conductive heat sink 50. The mounting frame 48 includes upstanding posts 52 that have threaded upper ends to receive cooperative shoulder screws 60. The posts 52 are inserted through corresponding holes 54 in the circuit board 34, through corresponding holes 56 in the frame 12 of the socket assembly 10 and through corresponding holes 58 in the heat sink 50. The shoulder screws 60 each have a surrounding spring 62. The shoulder screws 60 pass through a washer 64 and are screwed into the threads of the posts 52 until the shoulder screw 60 bottoms out on the upper end of the respective post 52. The springs 62 apply a compressive force to the overall assembly to maintain the bottom surface of the heatsink 50 in abutting relation with the upper surface of the integrated circuit package 20, to maintain the contacts of the integrated circuit package 20 in electrical engagement with the upper ends of the conductive columns 38, to maintain the lower ends of the conductive columns 38 in electrical engagement with the corresponding contacts on the circuit board 34 and to maintain the conductive shielding members 24 in electrically conductive abutting relation with the heat sink 50 and corresponding ground areas 40 on the circuit board 34. In the foregoing manner, the conductive shielding members 24 and the heat sink 50 are cooperative to form an effective EMI shield for the integrated circuit package 20.

In an alternative embodiment, the posts 52 are threaded and cooperative cap nuts are employed in place of the shoulder screws 60 to secure the assembly.

Figure 4A:
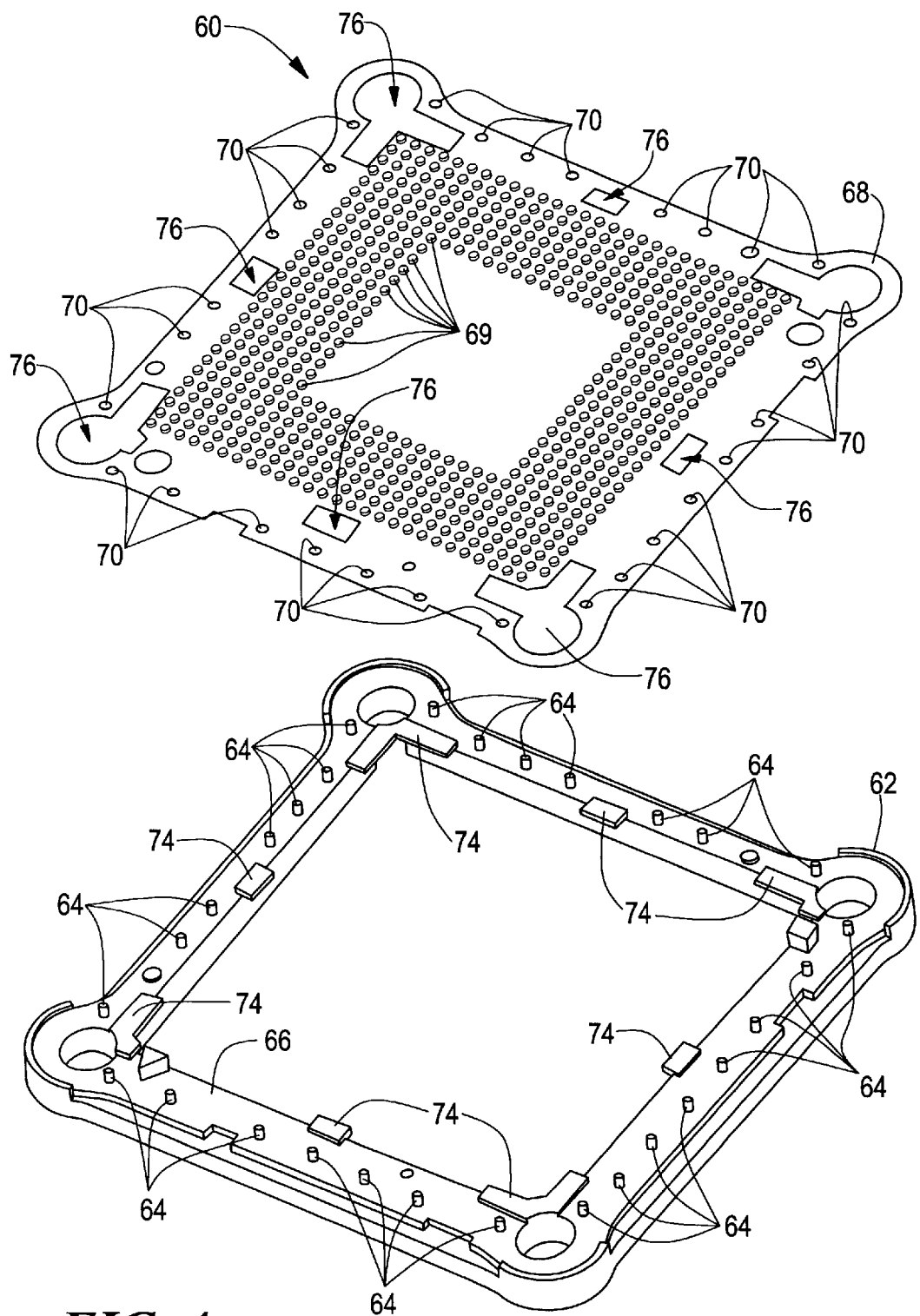
FIG. 4a is an exploded bottom pictorial view of embodiment of a socket assembly that includes a contact assembly that may be fixably mounted to the frame of the socket assembly via a cold forming process.
Figure 4B:
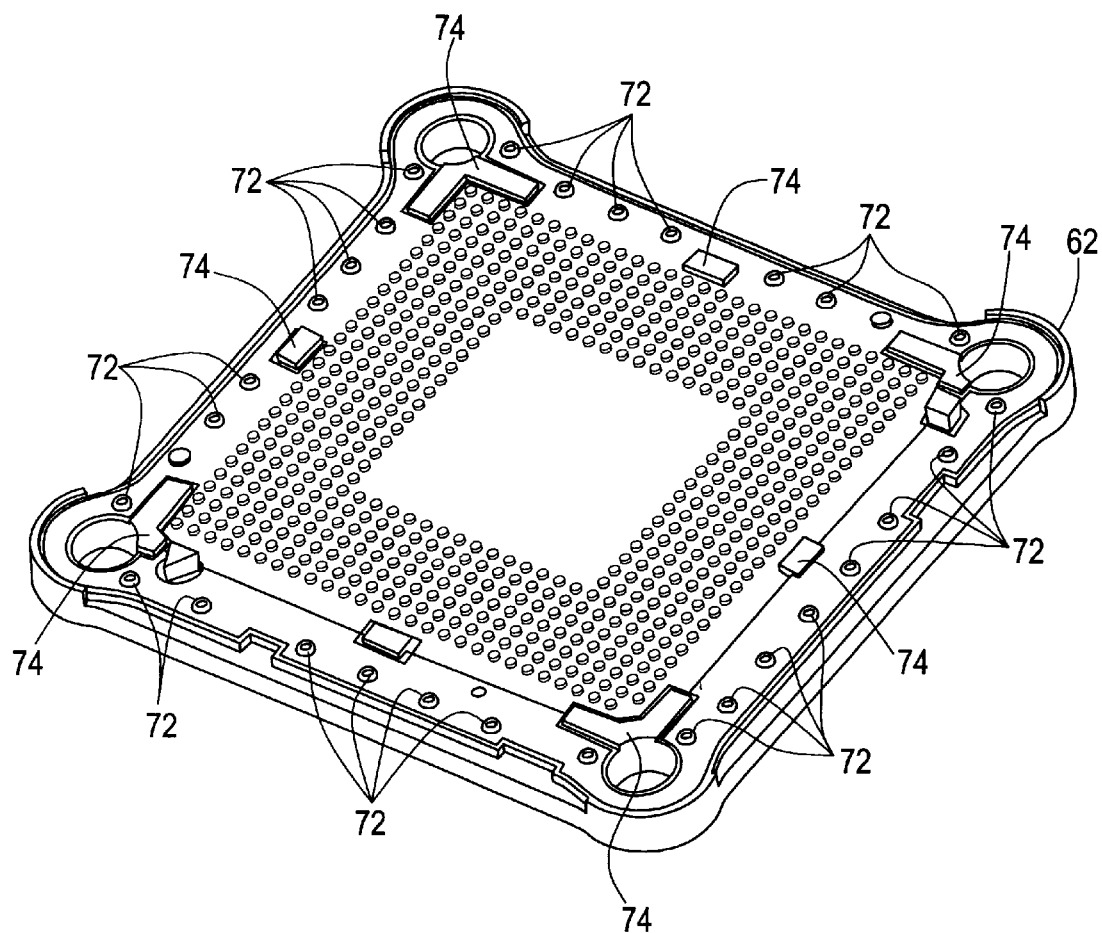
FIG. 4b is a bottom pictorial view of the socket assembly of FIG. 4a following cold staking of frame posts to securely mount the contact assembly to the frame.

In another embodiment depicted in FIGS. 4a and 4b, a contact assembly 60 comprising an insulating sheet 68 and a plurality of conductive columns 69 mounted in a corresponding plurality of apertures within the sheet 68 is fixably mounted to a frame 62 via a cold staking process so as to avoid the need for the use of adhesives in the manufacturing process. More specifically, the frame 62 includes a plurality of integrally formed posts 64 extending from the bottom surface 66 of the frame 62 and along the edges of the frame 62. The insulating sheet 68 includes a plurality of apertures 70 that are selectively sized and positioned such that the posts 64 extend through the apertures 70 of the insulating sheet 68 when the insulating sheet 68 is disposed on the bottom surface 66 of the frame 62 in a mounting position. To secure the insulating sheet 68 to the frame 62, the heads 72 of the respective posts 64 and fixably secures the insulating sheet 68 to the frame 62 as depicted in FIG. 4b.

Spacer abutments 74 are formed integrally with the frame 62 and extend from the bottom surface of the frame 62. Openings 76 are provided in the insulating sheet 68 and the spacer abutments 74 extend through the openings 76 in the insulating sheet 68 when the insulating sheet 68 is positioned on the bottom surface 66 of the frame 62 in the contact assembly mounting position. The spacer abutments 74 are of a predetermined height from the bottom surface 66 that is greater than the height of the post ends following the cold staking operation so as to provide a planar mounting base for the frame 62. More specifically, the spacer abutments 74 provide a planar base for the frame 62 notwithstanding variations in the distance of the post heads 72 from the bottom surface 66 of the frame 62 as a consequence of variations in the deformation of the posts 64 during the cold staking operation.

Additionally, when the socket assembly is positioned on a printed circuit board in a mounting position, the spacer abutments 74 provide a planar surface to precisely space the insulating sheet 68 from the surface of the printed circuit board. By precisely spacing the bottom surface 66 of the frame 62 from the circuit board, an appropriate compressive force can be assured between the lower ends of the conductive columns 69 of the contact assembly 60 and corresponding conductive pads on the printed circuit board. In this manner, the contact assembly 60 may be secured to the frame 62 without the use of an adhesive. Additionally, the contact assembly 60 may thus be secured to the frame 62 in a low cost manner using high speed manufacturing equipment.

It should be noted that an insulating sheet may be affixed a frame such as frame 12 (FIG. 2) that is adapted to receive conductive shielding members 24 using the above-described coldstaking technique. When using the cold staking technique for affixing the insulating sheet to the frame 12, the frame 12 includes integral posts that project through corresponding openings in the insulating sheet to allow for staking of the post heads.

It will be appreciated by those of ordinary skill in the art that other modification to and variations of the above described socket assembly and system and method for securing the contact assembly to the frame may be made without departing from the inventive concepts disclosed herein. Accordingly, the invention should not be viewed as limited except by the scope and spirit of the appended claims.

What is claimed is:

1. A method for assembling an integrated circuit device socket comprising the steps of:

aligning a contact assembly with an integrated circuit socket frame, said frame having a plurality of posts extending therefrom in a predetermined post pattern, said posts having a head end, said contact assembly including a flexible insulating sheet having a first plurality of apertures and a corresponding plurality of conductive contacts mounted in respective ones of said apertures, said insulating sheet further including a second plurality of apertures selectively located in said predetermined post pattern and sized to receive said posts, said posts extending through respective ones of said second plurality of apertures following said aligning step; and deforming said head ends of said posts to expand at least the head ends of the posts so as to fixably mount the contact assembly to the frame.

2. The method of claim 1 wherein said deforming step comprises the step of cold forming said head ends of said posts.

3. The method of claim 1 wherein said deforming step comprises the step of staking said head ends of said posts.

4. The method of claim 1 wherein said deforming step comprises the step of cold staking said head ends of said posts.

5. The method of claim 4 wherein said step of cold staking said head ends of said posts comprises the step of applying a center punch generally to the center of said posts to deform said head ends.

6. An integrated circuit socket assembly comprising:

an integral generally rectangular frame, said frame including four side portions defining an opening sized to receive an integrated circuit, said frame including a plurality of posts of a first diameter, said posts extending from a bottom surface of said side portions in a predetermined post pattern;

a contact assembly comprising an insulating sheet having a first plurality of apertures of a second diameter, said first plurality of apertures arranged in a predetermined contact pattern, said contact assembly further including a plurality of conductive contacts mounted within respective ones of said first plurality of apertures, said insulating sheet including a second plurality of apertures arranged in said predetermined post pattern;

said insulating sheet being disposed in abutting relation with said bottom surface of said frame with said post ends extending through said corresponding apertures within said insulating sheet; and said posts having enlarged head ends generally of a diameter greater than a diameter of the corresponding posts and the second plurality of apertures, respectively so as to fixably mount said insulating sheet to said frame.

7. The integrated circuit socket assembly of claim 6 wherein said frame further includes a plurality of abutments extending from the bottom surface of said frame, said abutments having a generally coplanar lower surface, said lower surface spaced apart from said frame bottom surface by a first distance, wherein said first distance is greater than the distance from the head ends of said post to said frame bottom surface.

8. The integrated circuit socket assembly of claim 6 wherein said second diameter is greater than said first diameter.

9. The integrated circuit socket assembly of claim 6 wherein said side portions have a top surface and a bottom surface and each side portion include a slot extending along at least a portion of the length of the respective side portion from the top surface through the respective side portion to the bottom surface; and said socket assembly further includes a conductive shielding member disposed within each of said slots.

10. The integrated circuit socket assembly of claim 9 wherein said conductive shielding member comprises a resilient conductive shielding member.

11. The integrated circuit socket assembly of claim 9 wherein each conductive shielding member extends above the top surface and below the bottom surface of the respective side portion.

* * * * *